(12) United States Patent
Noguchi et al.

(10) Patent No.: US 12,018,936 B2
(45) Date of Patent: Jun. 25, 2024

(54) MOUNTING APPARATUS AND PARALLELISM DETECTION METHOD IN MOUNTING APPARATUS

(71) Applicant: SHINKAWA LTD., Tokyo (JP)

(72) Inventors: Yuichiro Noguchi, Tokyo (JP); Alexander Dzhangirov, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 238 days.

(21) Appl. No.: 17/630,515

(22) PCT Filed: Jul. 30, 2020

(86) PCT No.: PCT/JP2020/029216
§ 371 (c)(1),
(2) Date: Jan. 27, 2022

(87) PCT Pub. No.: WO2022/024291
PCT Pub. Date: Feb. 3, 2022

(65) Prior Publication Data
US 2022/0412733 A1    Dec. 29, 2022

(51) Int. Cl.
*G01B 21/22* (2006.01)
*G01B 21/08* (2006.01)
*H01L 23/00* (2006.01)

(52) U.S. Cl.
CPC ............ *G01B 21/22* (2013.01); *G01B 21/08* (2013.01); *H01L 24/81* (2013.01); *H01L 2224/8118* (2013.01)

(58) Field of Classification Search
CPC ......... G01B 21/22; G01B 21/08; H01L 24/81; H01L 2224/8118
See application file for complete search history.

(56) References Cited

U.S. PATENT DOCUMENTS 7,066,373 B2 * 6/2006 Behler .................... H01L 21/68
228/103
8,454,771 B2    6/2013 Horikoshi
(Continued)

FOREIGN PATENT DOCUMENTS

CN    101779270         7/2010
CN    116114392 A  *   5/2023
(Continued)

OTHER PUBLICATIONS

"International Search Report (Form PCT/ISA/210) of PCT/JP2020/029216," dated Oct. 20, 2020, pp. 1-3.
(Continued)

*Primary Examiner* — Octavia Davis Hollington
(74) *Attorney, Agent, or Firm* — JCIPRNET

(57) ABSTRACT

The present invention provides a mounting apparatus and a parallelism detection method in the mounting apparatus. The parallelism detection method in the mounting apparatus includes: a first height detection process of detecting first heights of a mounting tool when a holding surface comes into contact with the a tip of a triangular pin by placing the triangular pin on a placement surface of a stage and lowering the mounting tool; a second height detection process of detecting second heights of the mounting tool when the tip of the triangular pin comes into contact with the placement surface by holding the triangular pin on the holding surface of the mounting tool and lowering the mounting tool; and a parallelism calculation process of calculating the parallelism between the placement surface of the stage and the holding surface of the mounting tool based on the first heights and the second heights.

14 Claims, 10 Drawing Sheets

(56) References Cited

U.S. PATENT DOCUMENTS

| | | | |
|---|---|---|---|
| 9,299,620 | B2 | 3/2016 | Horikoshi |
| 2005/0061852 | A1 | 3/2005 | Behler |

FOREIGN PATENT DOCUMENTS

| | | | | | |
|---|---|---|---|---|---|
| JP | H0476930 | | | 3/1992 | |
| JP | H0476931 | | | 3/1992 | |
| JP | H0482243 | A | * | 3/1992 | |
| JP | H0786319 | | | 3/1995 | |
| JP | 3097314 | B2 | * | 10/2000 | |
| JP | 2005150582 | A | * | 6/2005 | |
| JP | 2010114102 | | | 5/2010 | |
| JP | 2010232234 | A | * | 10/2010 | ............ H01L 24/75 |
| JP | 2014017328 | | | 1/2014 | |
| JP | 2016139629 | | | 8/2016 | |
| KR | 20090050989 | A | * | 5/2009 | |
| KR | 20170041864 | A | * | 4/2017 | |

OTHER PUBLICATIONS

"Office Action of China Counterpart Application", issued on Mar. 22, 2024, with partial English translation thereof, p. 1-p. 15.

* cited by examiner

MOUNTING APPARATUS AND PARALLELISM DETECTION METHOD IN MOUNTING APPARATUS

CROSS-REFERENCE TO RELATED APPLICATION

This application is a 371 application of the International PCT application serial no. PCT/JP2020/029216, filed on Jul. 30, 2020. The entirety of the above-mentioned patent applications is hereby incorporated by reference herein and made a part of this specification.

BACKGROUND

Technical Field

The present invention relates to a structure of a mounting apparatus that mounts a semiconductor chip on a mounted body such as a substrate, and a method for detecting parallelism between a stage of the mounting apparatus and a mounting head.

Description of Related Art

There is widely known a mounting apparatus that drives a mounting head with a semiconductor chip sucked and held on a holding surface at the tip of the mounting head and mounts the semiconductor chip on a substrate that is attracted and held on a placement surface of the stage. In such a mounting apparatus, in order to bond the semiconductor chip to the surface of the substrate well, the placement surface of the stage and the holding surface of the mounting head must be parallel with high accuracy.

For this reason, methods to detect the inclination of the holding surface have been proposed. For example, Patent Literature 1 discloses a method of detecting an inclination of a holding surface based on a plurality of heights detected by providing a protrusion on an intermediate stage of a bonding apparatus that performs flip-chip bonding and detecting a plurality of heights of a mounting head when a plurality of positions of the holding surface of the mounting head are brought into contact with the protrusions.

Further, the stage on which the substrate is placed has a built-in heater for heating the substrate, and the placement surface may be inclined due to the influence of temperature. For this reason, Patent Literature 2 discloses a method of detecting the flatness of a stage by arranging a laser displacement meter on an upper surface of a stage and moving the laser displacement meter in the X direction and the Y direction to measure changes in the height of the stage.

RELATED ART

Patent Literature

[Patent Literature 1] Japanese Unexamined Patent Publication No. 2016-139629
[Patent Literature 2] Japanese Unexamined Patent Publication No. 7-86319

SUMMARY

Problems to be Solved

In the prior art described in Patent Literatures 1 and 2, the inclination of the holding surface and the inclination of the stage are detected by separate devices, which may complicate the mounting apparatus.

Therefore, an object of the present invention is to detect the parallelism between the placement surface of the stage and the holding surface of the mounting head by a simple method.

Means for Solving the Problems

The parallelism detection method in a mounting apparatus mounts a semiconductor chip on a mounted body according to the present invention includes: a preparation process of preparing the mounting apparatus including a stage including a placement surface on which the mounted body is placed, a mounting head that sucks and holds the semiconductor chip on a holding surface facing the placement surface of the stage and moves in an X direction and an Y direction along the placement surface of the stage and a Z direction that comes into contact with and separates from the placement surface, and an encoder that detects a height of the mounting head; a first height detection process of detecting a plurality of the first heights of the mounting head, by arranging a first measurement tool having a predetermined height on the placement surface of the stage and repeatedly executing, at a plurality of measurement positions, an operation of lowering the mounting head to detect a first height of the mounting head by the encoder when the holding surface comes into contact with an upper end of the first measurement tool, when the upper end of the first measurement tool comes into contact with the holding surface; a second height detection process of detecting a plurality of the second heights of the mounting head, by holding a second measurement tool on the holding surface of the mounting head and repeating executing, at the plurality of measurement positions, an operation of lowering the mounting head to detect a second height of the mounting head by the encoder when a lower end of the second measurement tool held on the holding surface comes into contact with the placement surface, when the lower end of the second measurement tool comes into contact with the placement surface; and a parallelism calculation process of calculating a parallelism between the placement surface of the stage and the holding surface of the mounting head based on the plurality of the first heights and the plurality of the second heights.

As a result, the parallelism between the placement surface of the stage and the holding surface of the mounting head can be detected by a simple method of detecting the height of the mounting head.

According to the parallelism detection method of the present invention, the parallelism calculation process calculates a first difference between the plurality of the first heights and a second difference between the plurality of the second heights, at the plurality of measurement positions; and calculates the parallelism as an absolute value of a difference between the first difference and the second difference.

With such a simple calculation, the parallelism between the placement surface of the stage and the holding surface of the mounting head can be calculated.

According to the parallelism detection method of the present invention, the plurality of measurement positions are a pair of positions arranged in the X direction and another pair of positions arranged in the Y direction, and the parallelism calculation process calculates a first X difference between a pair of the first heights and a second X difference between a pair of the second heights, at the pair of positions; calculates an X-direction parallelism as an absolute value of a difference between the first X difference and the second X difference; calculates a first Y difference between the another pair of the first heights and a second Y difference between the another pair of the second heights, at the another pair of positions; calculates an Y-direction parallelism as an absolute value of a difference between the first Y difference and the second Y difference; and calculates the parallelism as a sum of the X-direction parallelism and the Y-direction parallelism.

As a result, the parallelism of the two surfaces can be detected, taking into account the parallelism between the placement surface of the stage and the holding surface of the mounting head in the X direction and the parallelism in the Y direction.

According to the parallelism detection method of the present invention, the plurality of measurement positions are four positions arranged in a grid pattern in the X direction and the Y direction, and the parallelism calculation process calculates a first set of first X difference between a pair of the first heights at a first set of pair of positions arranged in the X direction and a second set of first X difference between a pair of the first heights at a second set of pair of positions arranged in the X direction; calculates an average value of the first set of first X difference and the second set of first X difference as a first X difference; calculates a first set of second X difference between a pair of the second heights at the first set of a pair of positions and a second set of second X difference between a pair of the second heights at the second set of pair of positions; calculates an average value of the first set of second X difference and the second set of second X difference as a second X difference; calculates an X-direction parallelism as an absolute value of a difference between the first X difference and the second X difference; calculates a third set of first Y difference between a pair of the first heights at a third set of pair of positions arranged in the Y direction and a fourth set of first Y difference between a pair of the first heights at a fourth set of pair of positions arranged in the Y direction; calculates an average value of the third set of first Y difference and the fourth set of first Y difference as a first Y difference; calculates a third set of second Y difference between a pair of the second heights at a third set of pair of positions and a fourth set of second Y difference between a pair of the second heights at a fourth set of pair of positions; calculates an average value of the third set of second Y difference and the fourth set of second Y difference as a second Y difference; calculates an Y-direction parallelism as an absolute value of a difference between the first Y difference and the second Y difference; and calculates the parallelism as a sum of the X-direction parallelism and the Y-direction parallelism.

As a result, the parallelism between the placement surface of the stage and the holding surface of the mounting head in the X direction and the parallelism in the Y direction can be more accurately detected.

According to the parallelism detection method of the present invention, the holding surface is a square surface, and the upper end of the first measurement tool sequentially contacts four corners of the holding surface.

As a result, parallelism can be more accurately detected.

According to the parallelism detection method of the present invention, the first measurement tool and the second measurement tool are same cones having sharp tips, the tip becomes the upper end of the first measurement tool in the first height detection process when a bottom surface of the cone is placed on the placement surface, and the tip becomes the lower end of the second measurement tool in the second height detection process when the bottom surface is held on the holding surface.

As a result, parallelism can be detected with one type of measurement tool.

The mounting apparatus that mounts a semiconductor chip on a mounted body according to the present invention includes: a stage including a placement surface on which the mounted body is placed, a mounting head that sucks and holds the semiconductor chip on a holding surface facing the placement surface of the stage and moves in an X direction and an Y direction along the placement surface of the stage and a Z direction that comes into contact with and separates from the placement surface, an encoder that detects a height of the mounting head, and a controller that adjusts a movement of the mounting head and calculates a parallelism between the placement surface of the stage and the holding surface of the mounting head based on the height of the mounting head detected by the encoder, wherein the controller detects a plurality the first heights of the mounting head, by arranging a first measurement tool having a predetermined height on the placement surface of the stage and repeatedly executing, at a plurality of measurement positions, an operation of lowering the mounting head to detect a first height of the mounting head by the encoder when the holding surface comes into contact with an upper end of the first measurement tool, when the upper end of the first measurement tool comes into contact with the holding surface; detects a plurality of the second heights of the mounting head, by holding a second measurement tool on the holding surface of the mounting head and repeatedly executing, at the plurality of measurement positions, an operation of lowering the mounting head to detect a second height of the mounting head by the encoder when a lower end of the second measurement tool held on the holding surface comes into contact with the placement surface, when the lower end of the second measurement tool comes into contact with the placement surface; and calculates the parallelism between the placement surface of the stage and the holding surface of the mounting head based on the plurality of the first heights and the plurality of the second heights.

According to the mounting apparatus of the present invention, the controller calculates a first difference between the plurality of the first heights and a second difference between the plurality of the second heights, at the plurality of measurement positions; and calculates the parallelism as an absolute value of a difference between the first difference and the second difference.

According to the mounting apparatus of the present invention, the first measurement tool and the second measurement tool are same cones with sharp tips, the tip becomes the upper end of the first measurement tool when a bottom surface is placed on the placement surface, and the tip becomes the lower end of the second measurement tool when the bottom surface is held on the holding surface.

Effects

According to the present invention, the parallelism between the placement surface of the stage and the holding surface of the mounting head can be detected by a simple method.

DESCRIPTION OF THE EMBODIMENTS

Figure 1:
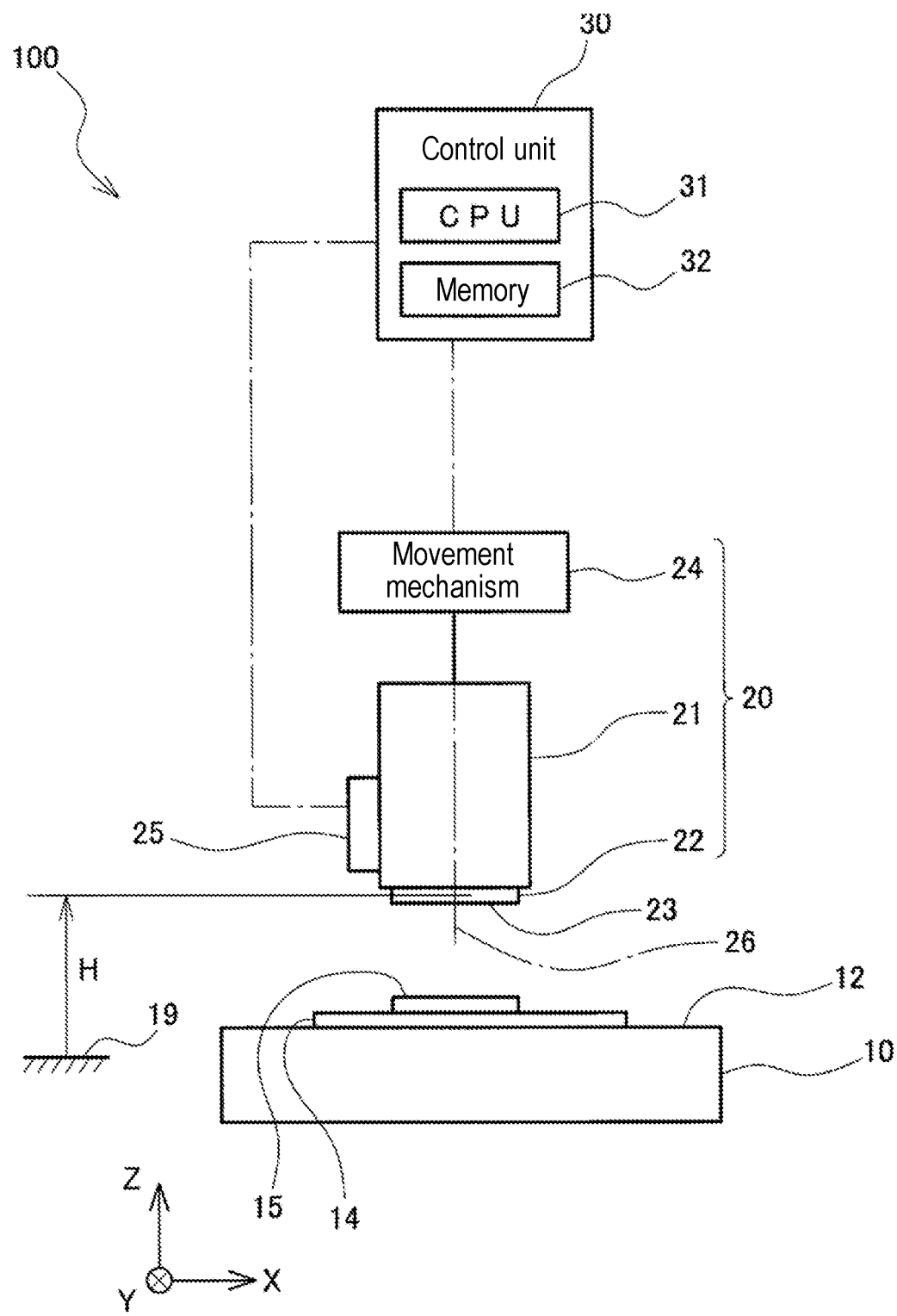
FIG. 1 is a configuration diagram of a mounting apparatus according to an embodiment.

Hereinafter, a mounting apparatus 100 of the embodiment as well as a method of detecting the parallelism between a placement surface 12 of a stage 10 and a holding surface 23 of a mounting head 20 by the mounting apparatus 100 will be described with reference to the drawings.

As shown in FIG. 1, the mounting apparatus 100 of the embodiment is a device including the stage 10, the mounting head 20, an encoder 25, and a controller 30, and mounting a semiconductor chip 15 on a substrate 14. In the following description, a direction along the placement surface 12 of the stage 10 is described as an X direction, a direction perpendicular to the X direction along the placement surface 12 is described as an Y direction, and a direction that comes into contact with and separates from the placement surface 12 is described as a Z direction or an up-down direction.

The stage 10 includes the placement surface 12 on which the substrate 14, the mounted body, is mounted on the upper surface. When the semiconductor chip 15 is mounted on the substrate 14, the substrate 14 is vacuum-sucked on the placement surface 12 and heated by a heater (not shown) mounted inside.

The mounting head 20 includes a main body 21, a mounting tool 22, and a movement mechanism 24. The main body 21 may be moved in the X direction, the Y direction, and the Z direction by the movement mechanism 24. The structure of the movement mechanism 24 is not particularly specified as long as the main body 21 is configured to be movable in the X direction, the Y direction, and the Z direction. However, as an example, a gantry frame movable in the Y direction, a slider attached to the gantry frame and moving in the X direction, and a Z-direction motor attached to the slider and moving the main body 21 in the Z direction may be configured. The mounting tool 22 is attached to the lower end of the main body 21 and sucks and holds the semiconductor chip 15 on the holding surface 23 facing the placement surface 12 of the stage 10. The mounting head 20 mounts the semiconductor chip 15 on the substrate 14 by heating the semiconductor chip 15 sucked and held on the holding surface 23 of the mounting tool 22 with a heater (not shown) and pressing the semiconductor 15 against the substrate 14. In the following description, the alternate long and short dash line extending in the Z direction through the center of the mounting tool 22 will be described as a center line 26 of the mounting head 20.

The encoder 25 detects the height of the mounting head 20. The encoder 25 may be set to detect the heights of various parts of the mounting head 20, but the mounting apparatus 100 of the embodiment will be described as detecting a height H of the mounting tool 22 from a reference surface 19. The reference surface 19 is a virtual surface set on the mounting apparatus 100.

The controller 30 is a computer including a CPU 31 which is a processor that processes information internally and a memory 32 that stores a program and data for executing the program. The movement mechanism 24 is connected to the controller 30 and moves the main body 21 of the mounting head 20 in the X direction, the Y direction, and the Z direction according to a command from the controller 30. Further, the encoder 25 inputs the detected height H to the controller 30. The CPU 31 of the controller 30 processes data of the height H input from the encoder 25 to calculate the parallelism between the placement surface 12 of the stage 10 and the holding surface 23 of the mounting head 20.

Hereinafter, a method of detecting the parallelism between the placement surface 12 of the stage 10 and the holding surface 23 of the mounting head 20 in the mounting apparatus 100 will be described with reference to FIG. 2 to FIG. 5. The following describes a case of detecting the parallelism between the placement surface 12 and the holding surface 23 by detecting the height at two points, a point A and a point B, on the placement surface 12 having different coordinate positions in the X direction. Here, XY coordinates of the point A are (x1, y1), and XY coordinates of the point B are (x2, y1). Also, a distance (x1-x2) between the point A and the point B in the X direction is shorter than a width of the mounting tool 22 in the X direction. Further, the XY coordinate (x1, y1) of the point A and the XY coordinate (x2, y1) of the point B are two measurement positions.

Figure 2:
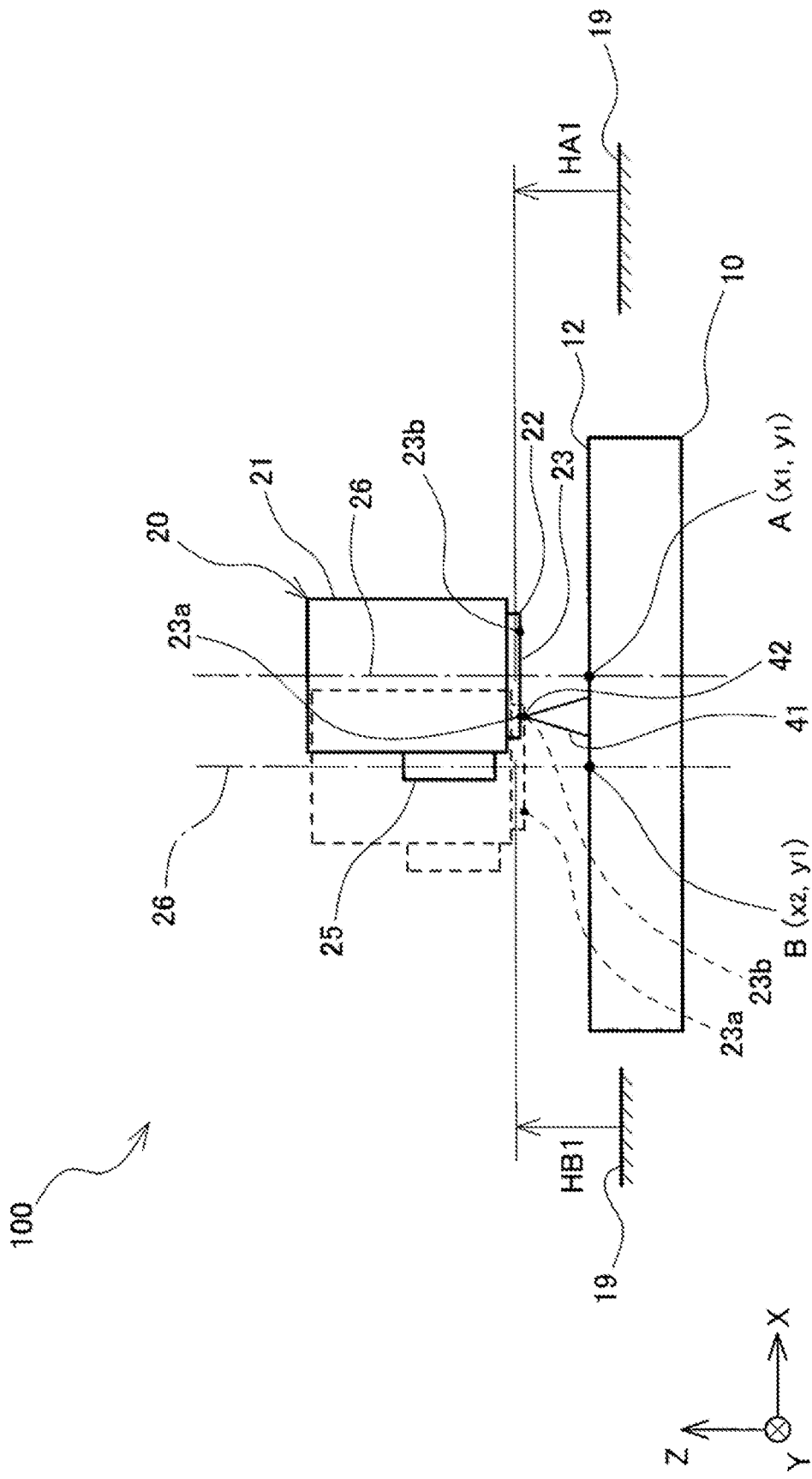
FIG. 2 is an explanatory diagram showing a first height detection process when detecting the parallelism between a placement surface of a stage and a holding surface of a mounting head in the mounting apparatus shown in FIG. 1.

First, the first height detection process will be described. As shown in FIG. 2, first, a triangular pin 41, which is both the first measurement tool and the second measurement tool, is arranged between the point A and the point B on the placement surface 12 of the stage 10. The triangular pin 41 is a cone having a sharp tip 42, and as shown in FIG. 2, the sharp tip 42 becomes the upper end of the first measurement tool when the bottom surface of the triangular pin 41 is placed on the placement surface 12. In the present embodiment, the first measurement tool is described as a having with a sharp tip, but any shape may be used as long as the tip is sharp.

The CPU 31 of the controller 30 moves the mounting head 20 in the X direction and the Y direction by the movement mechanism 24 at a movement height where the holding surface 23 of the mounting tool 22 is higher than the tip 42 of the triangular pin 41, and aligns XY coordinates of the center line 26 with the XY coordinates (x1, y1) of the point A. Next, the CPU 31 of the controller 30 lowers the mounting head 20 by the movement mechanism 24. Then, when the holding surface 23 of the mounting tool 22 comes into contact with the tip 42 of the triangular pin 41, the CPU 31 of the controller 30 acquires the height of the mounting tool 22 detected by the encoder 25 at that time as a first height HA1 of the point A. As shown in FIG. 2, the tip 42 of the triangular pin 41 comes into contact with a point 23a at an end of the holding surface 23 of the mounting tool 22 on the minus side in the X direction.

Detection of the holding surface 23 in contact with the tip 42 of the triangular pin 41 can be performed by various methods, for example, by detecting contact when a predetermined difference occurs between a height command value output by the CPU 31 to the movement mechanism 24 and the height H detected by the encoder 25, or by the fact that the detected height input from the encoder 25 does not change even if a command for lowering the mounting head 20 is output to the movement mechanism 24. Further, a load sensor (not shown) for detecting a Z-direction load applied to the mounting tool 22 may be attached to the main body 21 to detect contact when the Z-direction load detected by the load sensor exceeds a predetermined threshold value.

Next, the CPU 31 of the controller 30 raises the height of the holding surface 23 of the mounting head 20 to the movement height, and then, as shown by the broken line in FIG. 2, moves the mounting head 20 to the minus side in the X direction by the movement mechanism 24 and aligns the XY coordinates of the center line 26 with the XY coordinates (x2, y1) of the point B. Then, as in the case of the point A, when the mounting head 20 is lowered by the movement mechanism 24 and the holding surface 23 of the mounting head 20 comes into contact with the tip 42 of the triangular pin 41, the CPU 31 of the controller 30 acquires the height of the mounting tool 22 detected by the encoder 25 at that time as a first height HB1 of the point B. As shown by the broken line in FIG. 2, the tip 42 of the triangular pin 41 comes into contact with a point 23b at an end of the holding surface 23 of the mounting tool 22 on the positive side in the X direction. The point 23a of the holding surface 23 in contact with the point A moves to the minus side in the X direction with respect to the point B.

Figure 3:
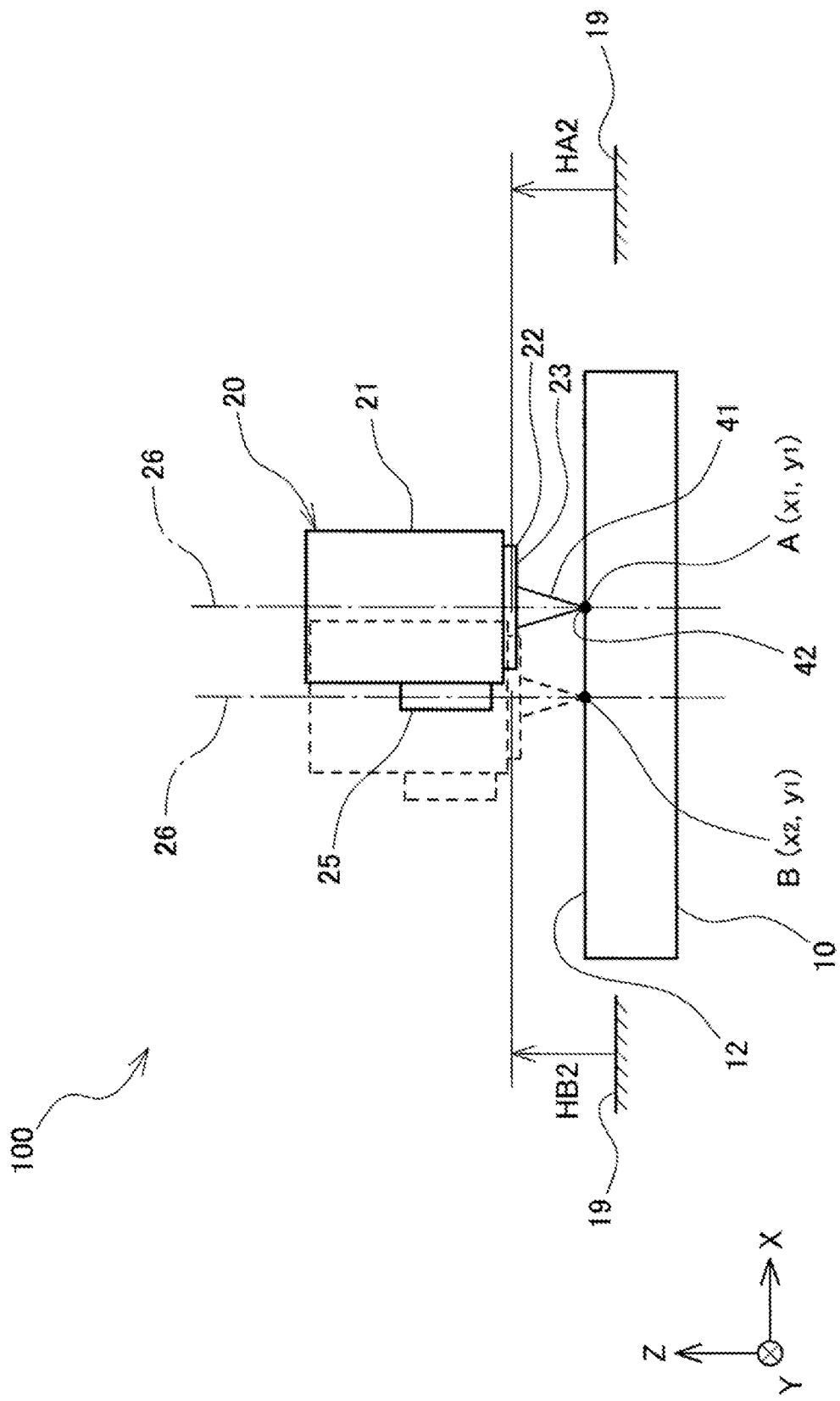
FIG. 3 is an explanatory diagram showing a second height detection process when detecting the parallelism between the placement surface of the stage and the holding surface of the mounting head in the mounting apparatus shown in FIG. 1.

Next, the second height detection process will be described with reference to FIG. 3. As shown in FIG. 3, the bottom surface of the triangular pin 41, which is both the first measurement tool and the second measurement tool, is sucked and held on the holding surface 23 so that the tip 42 extends toward the placement surface 12 of the stage 10. As shown in FIG. 3, the sharp tip 42 becomes the lower end of the second measurement tool when the bottom surface of the triangular pin 41 is sucked and held on the holding surface 23. Similar to the first height detection process, the CPU 31 of the controller 30 aligns the XY coordinates of the center line 26 of the mounting head 20 with the XY coordinates (x1, y1) of the point A, and then lowers the mounting head 20 to acquire the height of the mounting tool 22 when the tip 42 of the triangular pin 41 comes into contact with the placement surface 12 as a second height HA2 of the point A. In the second height detection process, detection of contact of the tip 42 of the triangular pin 41 with the placement surface 12 is performed in the same manner as the detection of the contact of the holding surface 23 with the tip 42 of the triangular pin 41 in the first height detection process.

Next, the CPU 31 of the controller 30 aligns the XY coordinates of the center line 26 of the mounting head 20 with the XY coordinates (x2, y1) of the point B, and then lowers the mounting head 20 to acquire the height of the mounting tool 22 when the tip 42 of the triangular pin 41 comes into contact with the placement surface 12 as a second height HB2 of the point B.

Figure 4:
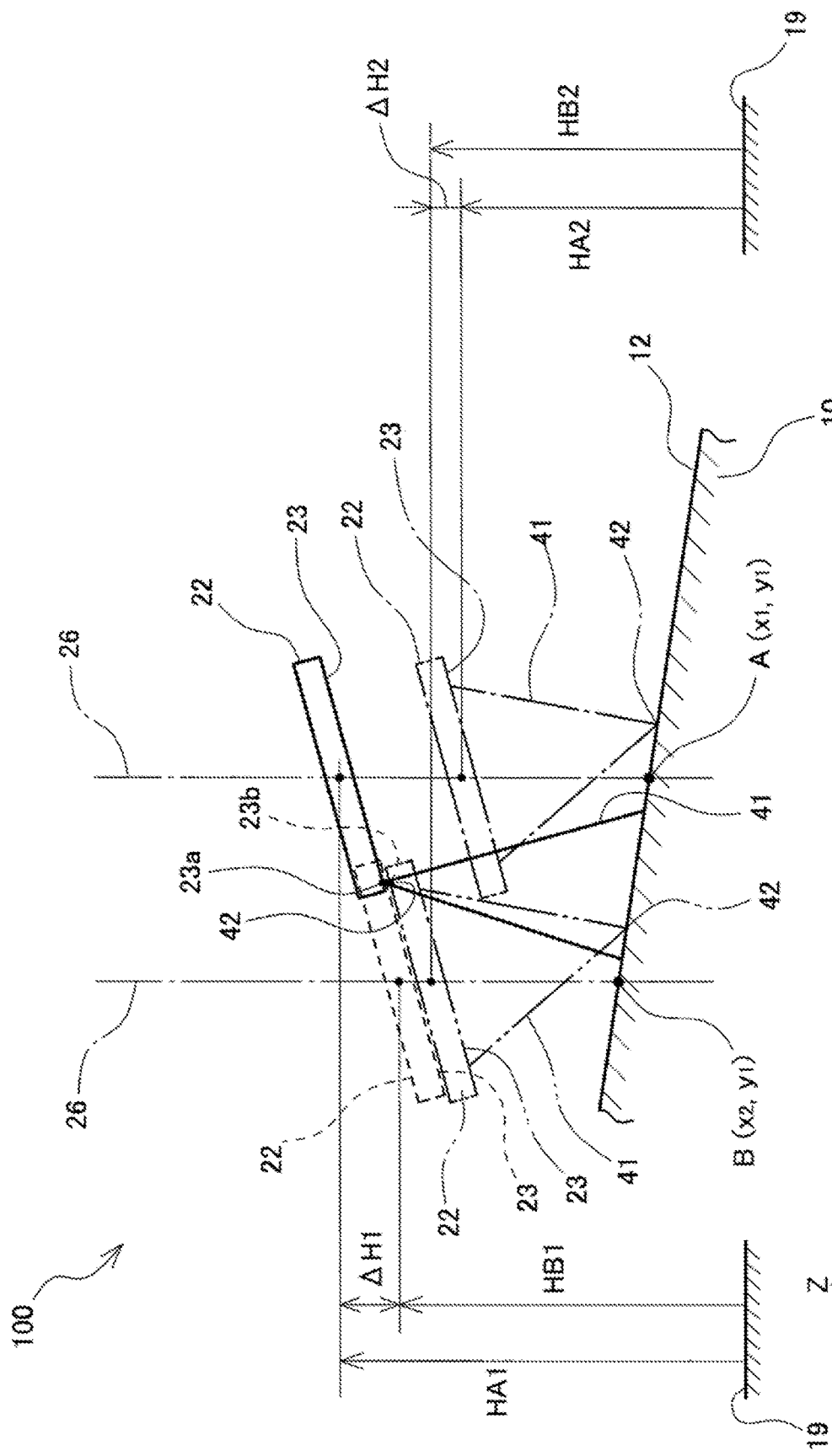
FIG. 4 is a schematic diagram showing a first difference and a second difference when the placement surface of the stage and the holding surface of the mounting head are different are inclined in different directions.

Next, the parallelism calculation process will be described with reference to FIG. 4. FIG. 4 is a schematic diagram showing the first height HA1 and the second height HA2 of the point A, the first height HB1 and the second height HB2 of the point B, a first difference $\Delta$H1, and a second difference $\Delta$H2 when the placement surface 12 of the stage 10 and the holding surface 23 of the mounting head 20 are inclined in different directions.

The mounting tool 22 shown by a solid line in FIG. 4 shows a state in which the holding surface 23 of the mounting tool 22 is in contact with the tip 42 of the triangular pin 41 when the XY coordinates of the center line 26 of the mounting head 20 are at the XY coordinates (x1, y1) of the point A. Further, the mounting tool 22 shown by a broken line in FIG. 4 shows a state in which the holding surface 23 of the mounting tool 22 is in contact with the tip 42 of the triangular pin 41 when the XY coordinates of the center line 26 of the mounting head 20 are at the XY coordinates (x2, y1) of the point B. Moreover, the mounting tool 22 and the triangular pin 41 shown by alternate long and short dash lines in FIG. 4 show a state in which the tip 42 of the triangular pin 41 is in contact with the placement surface 12 when the XY coordinates of the center line 26 of the mounting head 20 are at the XY coordinates (x1, y1) of the point A. Further, the mounting tool 22 and the triangular pin 41 shown by alternate long and two short dashes lines in FIG. 4 show a state in which the tip 42 of the triangular pin 41 is in contact with the placement surface 12 when the XY coordinates of the center line 26 of the mounting head 20 are at the XY coordinates (x2, y1) of the point B.

First, the CPU 31 of the controller 30 calculates the first difference $\Delta$H1, which is the difference between the first height HA1 at the point A and the first height HB1 at the point B.

$$\Delta H1 = HA1 - HB1 \quad \text{(Equation 1)}$$

In the case shown in FIG. 4, HA1>HB1, so $\Delta$H1>0).

Next, the CPU 31 of the controller 30 calculates the difference between the second height HA2 and the second height HB2 at the point A and the point B as the second difference $\Delta$H2.

$$\Delta H2 = HA2 - HB2 \quad \text{(Equation 2)}$$

In the case shown in FIG. 4, HA2<HB2, so $\Delta$H2<0.

Next, the CPU 31 of the controller 30 calculates the parallelism between the placement surface 12 and the holding surface 23 as the absolute value of the difference between the first difference $\Delta$H1 and the second difference $\Delta$H2.

$$\text{Parallelism} = |\Delta H1 - \Delta H2| = |(HA1 - HB1) - (HA2 - HB2)| \quad \text{(Equation 3)}$$

As described above, in the case shown in FIG. 4, since $\Delta$H2<0, the parallelism is larger than $\Delta$H1.

Figure 5:
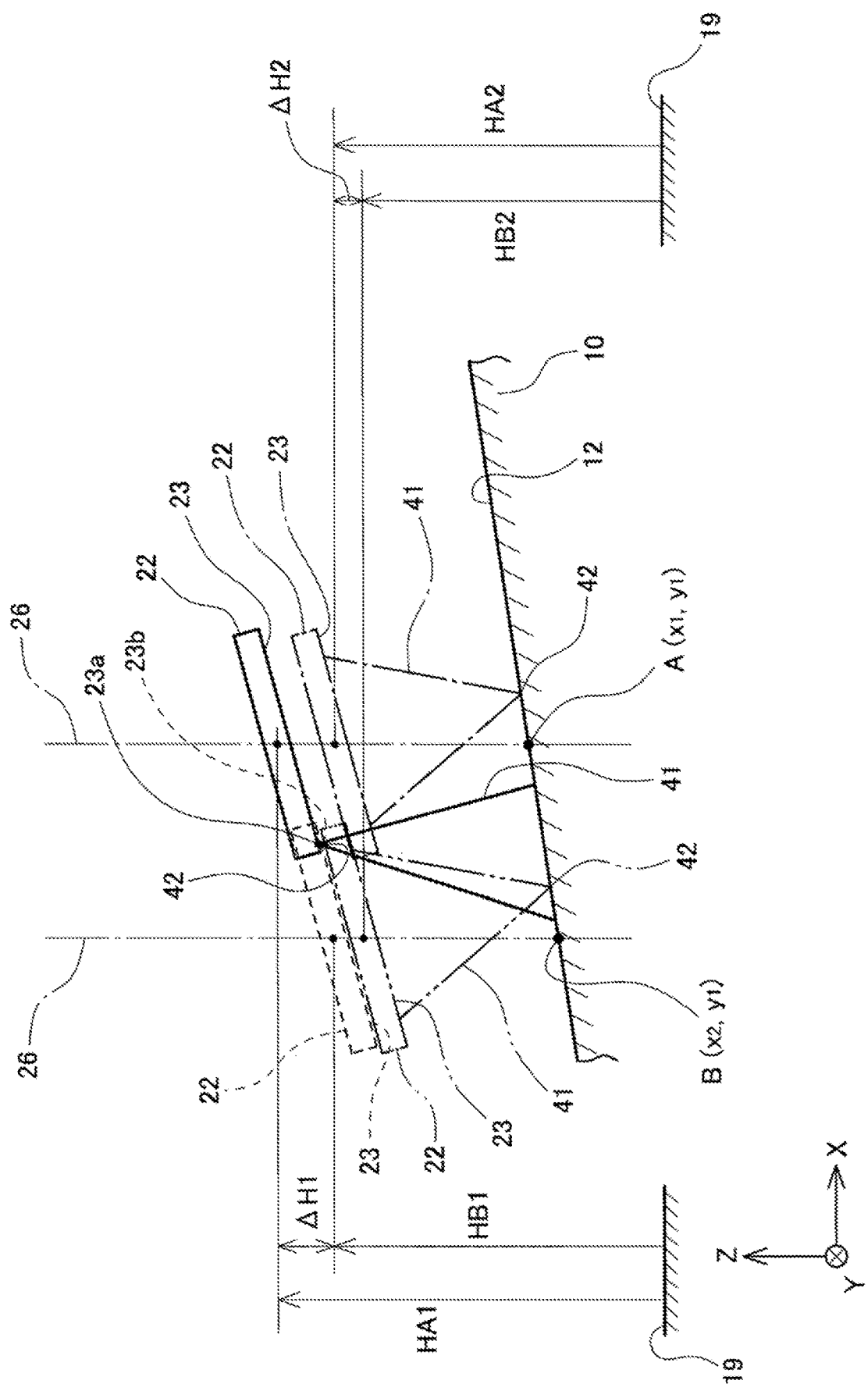
FIG. 5 is a schematic diagram showing a first difference and a second difference when the placement surface of the stage and the holding surface of the mounting head are inclined in the same direction.

Next, the calculation of the parallelism when the placement surface 12 of the stage 10 and the holding surface 23 of the mounting head 20 are inclined in the same direction will be described with reference to FIG. 5. Similar to FIG. 4, the mounting tool 22 shown by solid line, and the mounting tool 22 and the triangular pin 41 shown by alternate long and short dash lines in FIG. 5 show the case in which the XY coordinates of the center line 26 of the mounting head 20 are at the XY coordinates of the point A. The mounting tool 22 shown by broken line, and the mounting tool 22 and the triangular pin 41 shown by broken lines shown the case in which the XY coordinates of the center line 26 of the mounting head 20 are at the XY coordinates of the point B.

In the case shown in FIG. 5, as in the case shown in FIG. 4, the CPU 31 of the controller 30 calculates the first difference ΔH1 by the Equation 1 and the second difference ΔH2 by the Equation 2, and then calculates the parallelism between the placement surface 12 and the holding surface 23 by the Equation 3. In the case shown in FIG. 5, since ΔH1>0 and ΔH2>0, the parallelism is smaller than ΔH1.

As described above, the parallelism detection method of the embodiment can detect the parallelism between the placement surface 12 of the stage 10 and the holding surface 23 of the mounting head 20 by a simple method of interposing the triangular pin 41 between the holding surface 23 of the mounting tool 22 and the placement surface 12 of the stage 10 and detecting the height H of the mounting head 20 when the tip 42 of the triangular pin 41 comes into contact with the holding surface 23 or the placement surface 12.

The above describes the case of detecting the parallelism between the placement surface 12 and the holding surface 23 by detecting the heights at two points, the point A and the point B, having different coordinate positions in the X direction on the placement surface 12. Next, with reference to FIG. 6 and FIG. 7, a case will be described in which the heights are detected at four points, the point A, the point B, the point C, and the point D, arranged in a grid pattern in the X direction and the Y direction to detect the parallelism between the placement surface 12 and the holding surface 23. The XY coordinates of the point A are (x1, y1), the XY coordinates of the point B are (x2, y1), the XY coordinates of the point C are (x1, y2), and the XY coordinates of the point D are (x2, y2).

Figure 6:
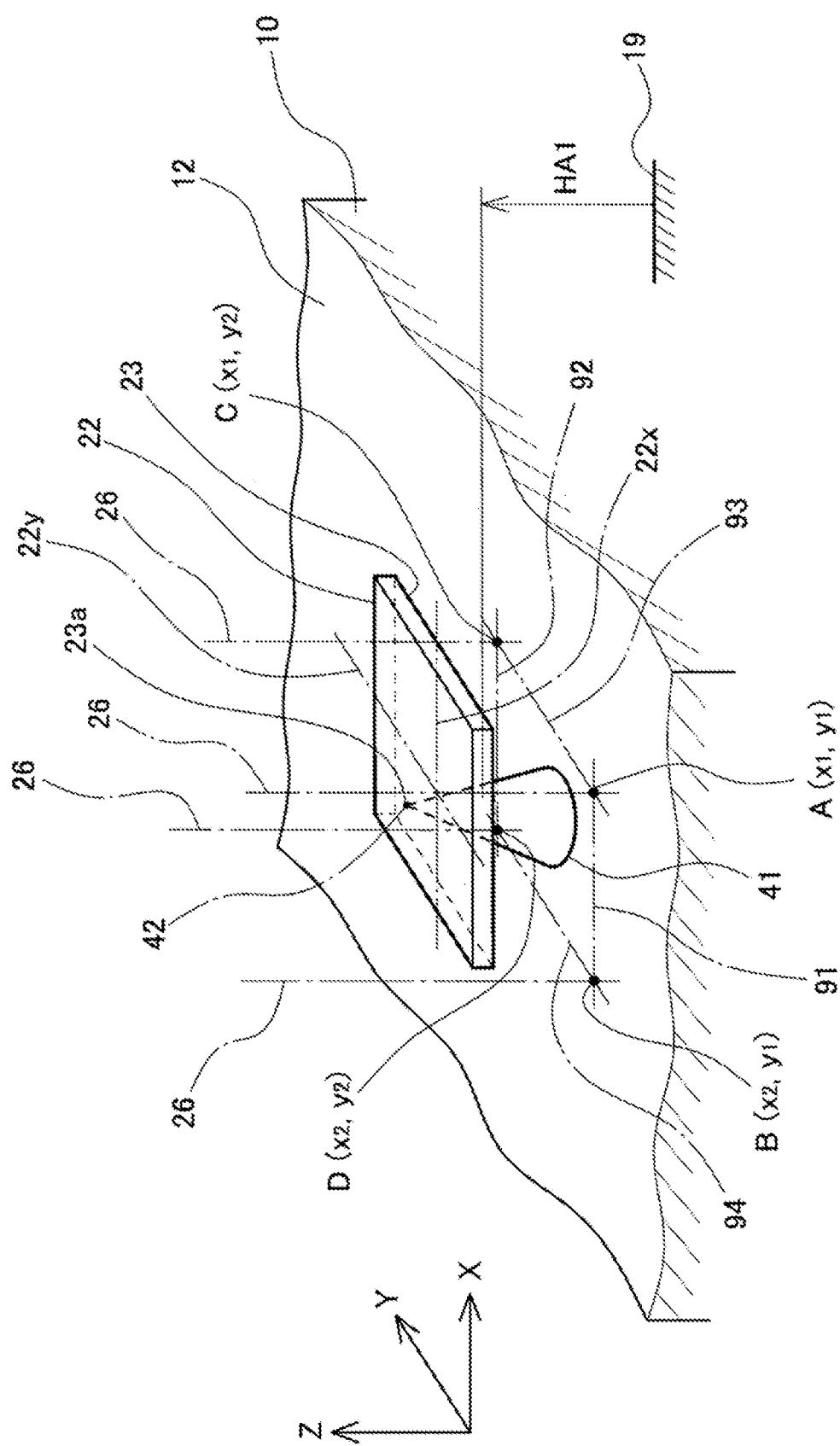
FIG. 6 is an explanatory drawing showing a first height detection process at four positions arranged in a grid pattern when detecting the parallelism between the placement surface of the stage and the holding surface of the mounting head in the mounting apparatus shown in FIG. 1.
Figure 7:
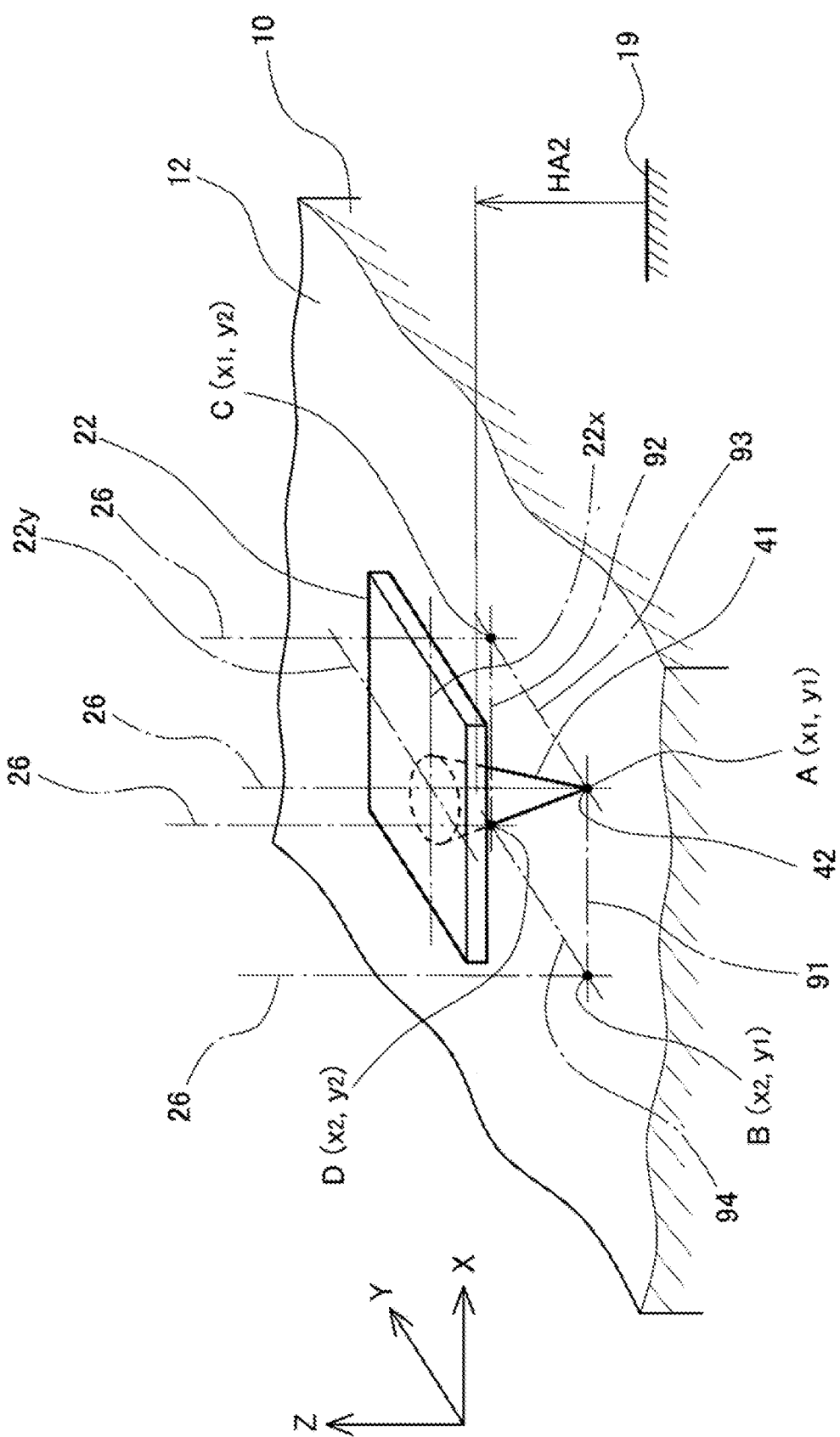
FIG. 7 is explanatory drawing showing a second height detection process at four positions arranged in a grid pattern when detecting the parallelism between the placement surface of the stage and the holding surface of the mounting head in the mounting apparatus shown in FIG. 1.

As shown in FIG. 6, the point A and the point B are arranged side by side in the X direction on a first line 91 extending in the X direction on the placement surface 12. The point C and the point D are arranged side by side in the X direction on a second line 92 extending in the X direction on the placement surface 12. Further, the point A and the point C are arranged side by side in the Y direction on a third line 93 extending in the Y direction, and the point B and the point D are arranged side by side in the Y direction on a fourth line 94 extending in the Y direction. In this way, the four points, the point A, the point B, the point C, and the point D, are arranged at each intersection of the first line 91 to the fourth line 94, which are arranged in a grid pattern in the X direction and the Y direction. Then, the point A and the point B correspond to a first set of pair of positions arranged in the X direction; the point C and the point D correspond to a second set of pair of positions arranged in the X direction; the point A and the point C correspond to a third set of pair of positions arranged in the Y direction; and the point B and the point D correspond to a fourth set of pair of positions arranged in the Y direction. In FIG. 6 and FIG. 7, an alternate long and short dash line 22x and an alternate long and short dash line 22y respectively indicates the center line in the X direction and the center line in the Y directions of the mounting tool 22. Further, in this example, the mounting tool 22 is a rectangular or a square quardrangle, and the holding surface 23 is a square plane.

First, the first height detection process will be described. The triangular pin 41 is set on the placement surface 12 in the same manner as described above with reference to FIG. 2 to FIG. 5. As shown in FIG. 6, the triangular pin 41 is arranged inside a quadrangle surrounded by the first line 91 to the fourth line 94. First, the CPU 31 of the controller 30 aligns the XY coordinates of the center line 26 of the mounting head 20 with the XY coordinates of the point A by the movement mechanism 24, and then lowers the mounting head 20 by the movement mechanism 24 to detect the first height HA1 from the reference surface 19 to the mounting tool 22 by the encoder 25 when the holding surface 23 comes into contact with the tip 42 of the triangular pin 41. At this time, the tip 42 of the triangular pin 41 comes into contact with the corner of the holding surface 23 on the negative side in the X direction and the positive side in the Y direction.

Similarly, the CPU 31 of the controller 30 aligns the XY coordinates of the center line 26 of the mounting head 20 with the XY coordinates of the point B, and lowers the mounting head 20 to detect the first height HB1. At this time, the tip 42 of the triangular pin 41 comes into contact with the corner of the holding surface 23 on the positive side in the X direction and the positive side in the Y direction. Next, the CPU 31 of the controller 30 aligns the XY coordinates of the center line 26 of the mounting head 20 with the XY coordinates of the point C and lowers the mounting head 20 to detect a first height HC1. At this time, the tip 42 of the triangular pin 41 comes into contact with the corner portion of the holding surface 23 on the negative side in the X direction and the negative side in the Y direction. Finally, the CPU 31 of the controller 30 aligns the XY coordinates of the center line 26 of the mounting head 20 with the XY coordinates of the point D and lowers the mounting head 20 to detect a first height HD1. At this time, the tip 42 of the triangular pin 41 comes into contact with the corner portion of the holding surface 23 on the positive side in the X direction and the negative side in the Y direction. In this way, after aligning the center line 26 of the mounting head 20 with the point A to the point D, the CPU 31 of the controller 30 then repeatedly lowers the mounting head 20 to measure the height of the mounting tool 22 when the holding surface 23 comes into contact with the tip 42 of the triangular pin 41, so as to acquire four first heights HA1, HB1, HC1, and HD1. At this time, the tip 42 of the triangular pin 41 sequentially contacts the four corners of the holding surface 23.

Next, the second height detection process will be described. Similar to the above described with reference to FIG. 2 to FIG. 5, as shown in FIG. 7, the bottom surface of the triangular pin 41 is sucked and held on the holding surface 23 so that the tip 42 extends toward the placement surface 12 of the stage 10. Then, as in the first height detection process, after aligning the center line 26 of the mounting head 20 with the point A to the point D, the CPU 31 of the controller 30 repeatedly lowers when the mounting head 20 to measure the height of the mounting tool 22 when the tip 42 of the triangular pin 41 comes into contact with the placement surface 12, so as to acquire second heights HA2, HB2, HC2, and HD2.

Next, the CPU 31 of the controller 30 calculates the first set of first X difference, the second set of first X difference, and the first X difference as follows. The first set of first X difference is the difference between the first height HA1 and the first height HB1 of the point A and the point B arranged at the first set of pair of positions arranged in the X direction, and is calculated by Equation 4.

$$\text{first set of first } X \text{ difference} = HA1 - HB1 \quad \text{(Equation 4)}$$

The second set of first X difference is the difference between the first height HC1 and the first height HD1 of the point C and the point D arranged at the second set of pair of positions arranged in the X direction, and the CPU 31 of the controller 30 calculates the second set of first X difference by following Equation 5.

$$\text{second set of first } X \text{ difference} = HC1 - HD1 \quad \text{(Equation 5)}$$

The CPU 31 of the controller 30 calculates the first X difference as the average value of the first set of first X difference and the second set of first X difference by following Equation 6.

$$\text{first } X \text{ difference} = \quad \text{(Equation 6)}$$
$$(\text{first set of first } X \text{ difference} + \text{second set of first}$$
$$X \text{ difference})/2 = [(HA1 - HB1) + (HC1 - HD1)]/2 =$$
$$(HA1 + HC1)/ - 2(HB1 + HD1)/2$$

Next, the CPU 31 of the controller 30 calculates the first set of second X difference, the second set of second X difference, and the second X difference as follows. The first set of second X difference is the difference between the second height HA2 and the second height HB2 of the point A and the point B, the first set; the second set of second X difference is the difference between the second height HC2 and the second height HD2 of the point C and the point D, the second set. The CPU 31 of the controller 30 calculates the first set of second X difference and the second set of second X difference by following Equation 7 and Equation 8.

$$\text{first set of second } X \text{ difference} = HA2 - HB2 \quad \text{(Equation 7)}$$

$$\text{second set of second } X \text{ difference} = HC2 - HD2 \quad \text{(Equation 8)}$$

The CPU 31 of the controller 30 calculates the second X difference as the average value of the first set of second X difference and the second set of second X difference as shown in following Equation 9.

$$\text{second } X \text{ difference} = \quad \text{(Equation 9)}$$
$$(\text{first set of second } X \text{ difference} + \text{second set of second}$$
$$X \text{ difference})/2 = [(HA2 - HB2) + (HC2 - HD2)]/2 =$$
$$(HA2 + HC2)/2 - (HB2 + HD2)/2$$

Then, the CPU 31 of the controller 30 calculates the X-direction parallelism from the first X difference and the second X difference as shown following Equation 10.

$$X\text{-direction parallelism} = |\text{first } X \text{ difference} - \text{second } X \text{ difference}| \quad \text{(Equation 10)}$$

Next, the CPU 31 of the controller 30 calculates a third set of first Y difference, a fourth set of first Y difference, and the first Y difference as follows. The third set of first Y difference is the difference between the first height HA1 and the first height HC1 of the point A and the point C, which are arranged at the third set of pair of positions arranged in the Y direction, and is calculated by Equation 11.

$$\text{third set of first } Y \text{ difference} = HA1 - HC1 \quad \text{(Equation 11)}$$

The fourth set of first Y difference is the difference between the first height HB1 and the first height HD1 of the point B and the point D, which are arranged at the fourth set of pair of positions arranged in the Y direction, and the CPU 31 of the controller 30 calculates the fourth set of first Y difference by following Equation 12.

$$\text{fourth set of first } Y \text{ difference} = HB1 - HD1 \quad \text{(Equation 12)}$$

The CPU 31 of the controller 30 calculates the first Y difference as the average value of the third set of first Y difference and the fourth set of first Y difference by following Equation 13.

$$\text{first } Y \text{ difference} = \quad \text{(Equation 13)}$$
$$(\text{third set of first } Y \text{ difference} + \text{fourth set of first}$$
$$Y \text{ difference})/2 = [(HA1 - HC1) + (HB1 - HD1)]/2 =$$
$$(HA1 + HB1)/2 - (HC1 + HD1)/2$$

Next, the CPU 31 of the controller 30 calculates the third set of second Y difference, the fourth set of second Y difference, and the second Y difference as follows. The third set of second Y difference is the difference between the second height HA2 and the second height HC2 of the point A and the point C, the third set; and the fourth set of second Y difference is the difference between the second height HB2 and the second height HD2 of the point B and the point D, the fourth set. The CPU 31 of the controller 30 calculates the third set of second Y difference and the fourth set of second Y difference by following Equation 14 and Equation 15.

$$\text{third set of second } Y \text{ difference} = HA2 - HC2 \quad \text{(Equation 14)}$$

$$\text{fourth set of second } Y \text{ difference} = HB2 - HD2 \quad \text{(Equation 15)}$$

The CPU 31 of the controller 30 calculates the second Y difference as the average value of the third set of second Y difference and the fourth set of second Y difference as shown in following Equation 16.

$$\text{second } Y \text{ difference} = \quad \text{(Equation 16)}$$
$$(\text{third set of second } Y \text{ difference} + \text{fourth set of second}$$
$$Y \text{ difference})/2 = [(HA2 - HC2) + (HB2 - HD2)]/2 =$$
$$(HA2 + HB2)/2 - (HC2 + HD2)/2$$

Then, the CPU 31 of the controller 30 calculates the Y-direction parallelism from the first Y difference and the second Y difference as shown in following Equation 17.

$$Y\text{-direction parallelism} = |\text{first } Y \text{ difference} - \text{second } Y \text{ difference}| \quad \text{(Equation 17)}$$

Finally, the CPU 31 of the controller 30 calculates the parallelism between the placement surface 12 and the holding surface 23 by summing up the X-direction parallelism and the Y-direction parallelism as shown in following Equation 18.

$$\text{Parallelism} = X\text{-direction parallelism} + Y\text{-parallelism} = \quad \text{(Equation 18)}$$
$$|\text{first } X \text{ difference} - \text{second } X \text{ difference}| +$$
$$|\text{first } Y \text{ difference} - \text{second } Y \text{ difference}|$$

As described above, when detecting the parallelism between the placement surface 12 and the holding surface 23 by detecting the height of the mounting tool 22 at four points, the point A, the point B, the point C, and the point D, which are arranged in a grid pattern in the X direction and the Y direction, the parallelism between the placement surface 12 of the stage 10 and the holding surface 23 of the mounting tool 22 can be detected taking into account the parallelism in the X direction and the parallelism in the Y direction, the parallelism can be detected more accurately.

When detecting the parallelism between the placement surface 12 and the holding surface 23 by detecting the height of the mounting tool 22 at four points, the four points do not have to be arranged in a grid pattern in the X direction and the Y direction. For example, they may be arranged at the vertices of a rhombus or a trapezoid.

Figure 8:
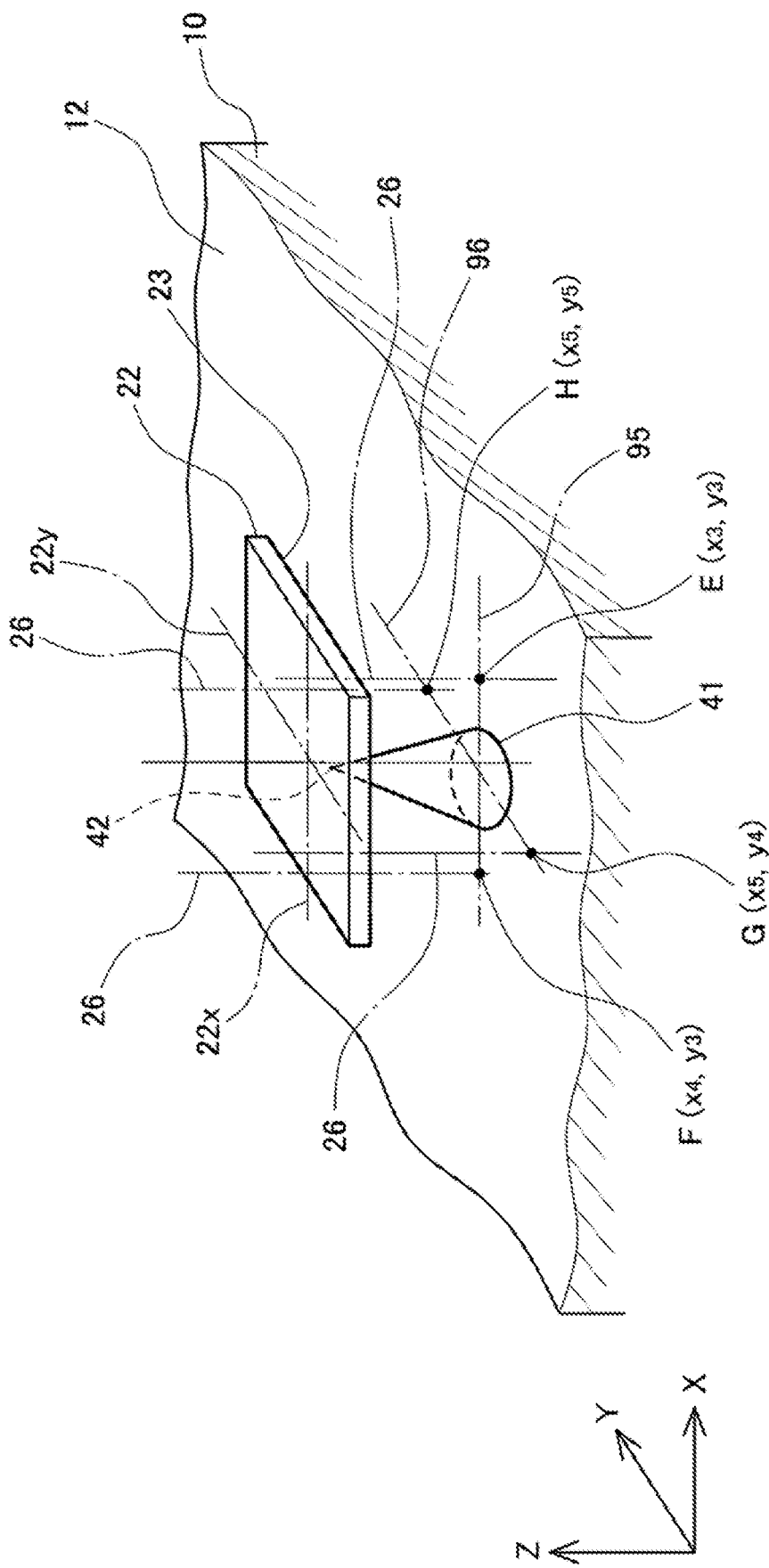
FIG. 8 is a is explanatory drawing showing a first height detection process at four positions arranged in a cross shape in the X direction and the Y direction when detecting the parallelism between the placement surface of the stage and the holding surface of the mounting head in the mounting apparatus shown in FIG. 1.

Further, as shown in FIG. 8, the four points may be arranged in a cross shape in the X direction and the Y direction. As shown in FIG. 8, they may include two points, a point E and a point F, arranged on a line 95 extending in the X direction and two points, and two points, a point G and a point H, arranged on a line 96 extending in the Y direction to be orthogonal to the line 95. In this case, the point E and the point F correspond to a pair of positions arranged in the X direction, and the point G and the point H correspond to another pair of positions arranged in the Y direction.

In this case, the CPU 31 of the controller 30 calculates the first X difference as the difference between a first height HE1 and a first height HF1 of the point E and the point F as shown in following Equation 19.

$$\text{first } X \text{ difference} = HE1 - HF1 \qquad \text{(Equation 19)}$$

Further, the second X difference is calculated as the difference between a second height HE2 and a second height HF2 of the point E and the point F as shown in following Equation 20.

$$\text{second } X \text{ difference} = HE2 - HF2 \qquad \text{(Equation 20)}$$

Then, the CPU 31 of the controller 30 calculates the X-direction parallelism by following Equation 21, as in the Equation 10 described above.

X-direction parallelism=|first X difference−second X difference| (Equation 21)

Similarly, the CPU 31 of the controller 30 calculates the first Y difference as the difference between a first height HG1 and a first height HH1 of the point G and the point H as shown in following Equation 22.

$$\text{first } Y \text{ difference} = HG1 - HH1 \qquad \text{(Equation 22)}$$

Further, the second Y difference is calculated as the difference between a second height HG2 and a second height HH2 of the point G and the point H as shown in following Equation 23.

$$\text{second } Y \text{ difference} = HG2 - HH2 \qquad \text{(Equation 23)}$$

Then, the CPU 31 of the controller 30 calculates the Y-direction parallelism by following Equation 24, as in the Equation 17 described above.

Y-direction parallelism=|first Y difference−second Y difference| (Equation 24)

Then, the CPU 31 of the controller 30 calculates the parallelism between the placement surface 12 and the holding surface 23 as in following Equation 25 by summing up the X-direction parallelism and the Y-direction parallelism, as in the Equation 18.

$$\begin{aligned}\text{Parallelism} = & \qquad \text{(Equation 25)} \\ X&\text{-direction parallelism} + Y\text{-ditrection parallelism} = \\ & |\text{first } X \text{ difference} - \text{second } X \text{ difference}| + \\ & \qquad |\text{first } Y \text{ difference} - \text{second } Y \text{ difference}|\end{aligned}$$

This method requires less calculation than detecting the height of the mounting tool 22 at the four points, the point A, the point B, the point C, and the point D, which are arranged in a grid pattern in the X direction and the Y direction described above, and can detect the parallelism between the placement surface 12 of the stage 10 and the holding surface 23 of the mounting tool 22 taking account of the parallelism in the X direction and the parallelism in the Y direction.

The above describes that the bottom surface of the triangular pin 41 is placed on the placement surface 12 and used as the first measurement tool, and the bottom surface of the same triangular pin 41 is held on the holding surface 23 and used as the second measurement tool, but the present invention is not limited thereto.

Figure 9:
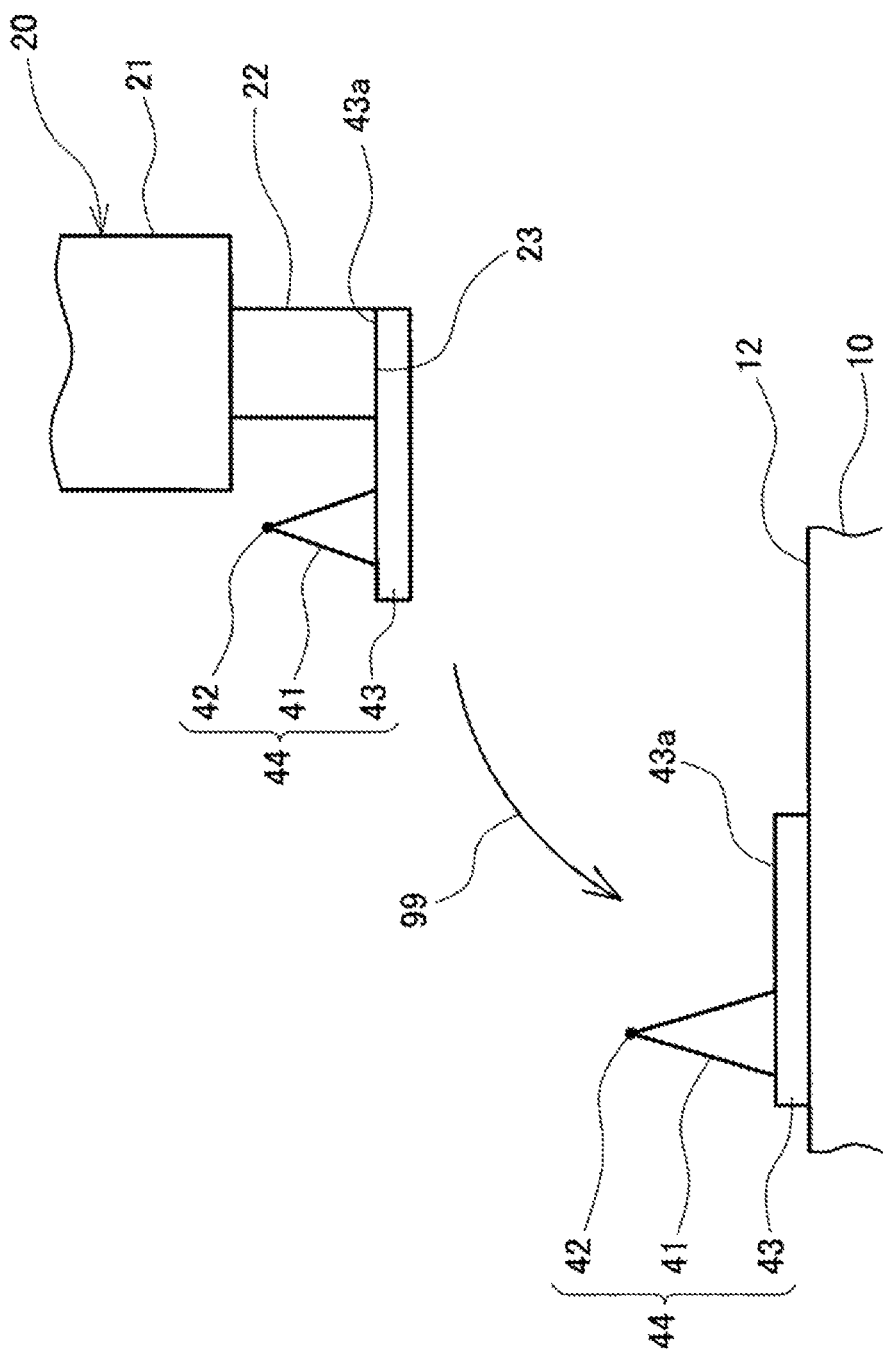
FIG. 9 is an elevational diagram showing another embodiment of a second measurement tool.

For example, a triangular pin assembly 44 as shown in FIG. 9 may be used as the second measurement tool. The triangular pin assembly 44 has the bottom surface of the triangular pin 41 fixed on a base 43. The base 43 extends toward a direction away from the triangular pin 41, and an upper surface 43a may be sucked and held on the holding surface 23 without the triangular pin 41 interfering with the mounting tool 22. With the upper surface 43a of the base 43 sucked and held on the holding surface 23 of the mounting tool 22, the mounting head 20 is moved to a predetermined position as shown by an arrow 99, and when the vacuum suction of the mounting tool 22 is stopped, the triangular pin assembly 44 may be set at a predetermined position on the placement surface 12.

Figure 10:
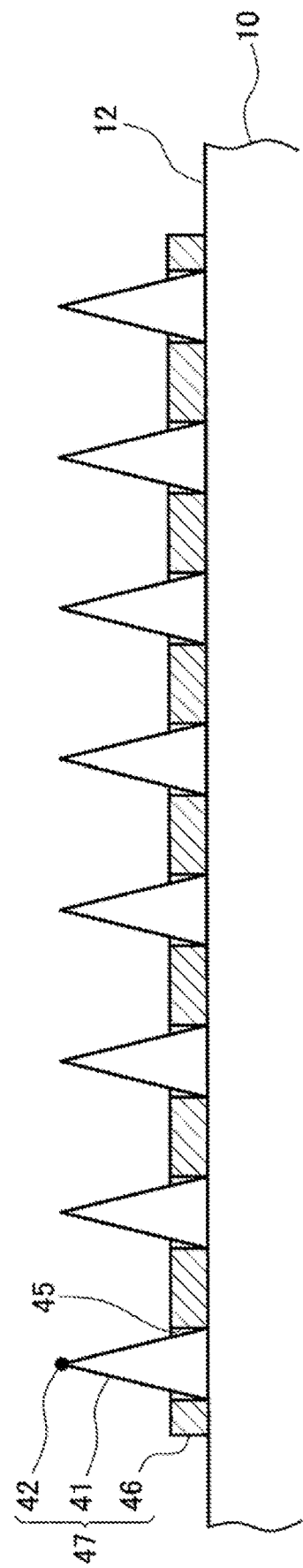
FIG. 10 is an elevational diagram showing another embodiment of a second measurement tool.

Further, as shown in FIG. 10, the second measurement tool may be configured by placing a jig 46 having a plurality of holes 45 on the placement surface 12 of the stage 10 and arranging a plurality of triangular pins 41 on the placement surface 12 by inserting each of the triangular pins 41 into the holes 45 so that the bottom surface is on the lower side. In this case, the plurality of triangular pins 41 and the jig 46 become a triangular pin arrangement body 47, which is the second measurement tool.

Further, in the above description, it has been described that the first height and the second height are detected by aligning the center line 26 of the mounting head 20 with the XY coordinates of the point A, the point B, or the point A to the point D, respectively, but the present invention is not limited thereto. For example, instead of the center line 26, a reference point of the mounting head 20 may be set, and the first height and the second height may be detected by aligning the coordinate position of the reference point with the XY coordinates of the point A, the point B, or the point A to the point D, respectively.

What is claimed is:

1. A parallelism detection method in a mounting apparatus that mounts a semiconductor chip on a mounted body, the parallelism detection method comprising:
a preparation process of preparing the mounting apparatus comprising a stage comprising a placement surface on which the mounted body is placed, a mounting head that sucks and holds the semiconductor chip on a holding surface facing the placement surface of the stage and moves in an X direction and an Y direction along the placement surface of the stage and a Z direction that comes into contact with and separates from the placement surface, and an encoder that detects a height of the mounting head;

a first height detection process of detecting a plurality of the first heights of the mounting head, by arranging a first measurement tool having a predetermined height on the placement surface of the stage and repeatedly executing, at a plurality of measurement positions, an operation of lowering the mounting head to detect a first height of the mounting head by the encoder when the holding surface comes into contact with an upper end of the first measurement tool, when the upper end of the first measurement tool comes into contact with the holding surface;

a second height detection process of detecting a plurality of the second heights of the mounting head, by holding a second measurement tool on the holding surface of the mounting head and repeating executing, at the plurality of measurement positions, an operation of lowering the mounting head to detect a second height of the mounting head by the encoder when a lower end of the second measurement tool held on the holding surface comes into contact with the placement surface, when the lower end of the second measurement tool comes into contact with the placement surface; and a parallelism calculation process of calculating a parallelism between the placement surface of the stage and the holding surface of the mounting head based on the plurality of the first heights and the plurality of the second heights.

2. The parallelism detection method according to claim 1, wherein the parallelism calculation process:

calculates a first difference between the plurality of the first heights and a second difference between the plurality of the second heights, at the plurality of measurement positions; and calculates the parallelism as an absolute value of a difference between the first difference and the second difference.

3. The parallelism detection method according to claim 2, wherein the plurality of measurement positions are a pair of positions arranged in the X direction and another pair of positions arranged in the Y direction, and the parallelism calculation process:

calculates a first X difference between a pair of the first heights and a second X difference between a pair of the second heights, at the pair of positions;

calculates an X-direction parallelism as an absolute value of a difference between the first X difference and the second X difference;

calculates a first Y difference between the another pair of the first heights and a second Y difference between the another pair of the second heights, at the another pair of positions;

calculates an Y-direction parallelism as an absolute value of a difference between the first Y difference and the second Y difference; and calculates the parallelism as a sum of the X-direction parallelism and the Y-direction parallelism.

4. The parallelism detection method according to claim 3, wherein the first measurement tool and the second measurement tool are same cones having sharp tips, the tip becomes the upper end of the first measurement tool in the first height detection process when a bottom surface of the cone is placed on the placement surface, and the tip becomes the lower end of the second measurement tool in the second height detection process when the bottom surface is held on the holding surface.

5. The parallelism detection method according to claim 2, wherein the plurality of measurement positions are four positions arranged in a grid pattern in the X direction and the Y direction, and the parallelism calculation process:

calculates a first set of first X difference between a pair of the first heights at a first set of pair of positions arranged in the X direction and a second set of first X difference between a pair of the first heights at a second set of pair of positions arranged in the X direction;

calculates an average value of the first set of first X difference and the second set of first X difference as a first X difference;

calculates a first set of second X difference between a pair of the second heights at the first set of pair of positions and a second set of second X difference between a pair of the second heights at the second set of pair of positions;

calculates an average value of the first set of second X difference and the second set of second X difference as a second X difference;

calculates an X-direction parallelism as an absolute value of a difference between the first X difference and the second X difference;

calculates a third set of first Y difference between a pair of the first heights at a third set of pair of positions arranged in the Y direction and a fourth set of first Y difference between a pair of the first heights at a fourth set of pair of positions arranged in the Y direction;

calculates an average value of the third set of first Y difference and the fourth set of first Y difference as a first Y difference;

calculates a third set of second Y difference between a pair of the second heights at a third set of pair of positions and a fourth set of second Y difference between a pair of the second heights at a fourth set of pair of positions;

calculates an average value of the third set of second Y difference and the fourth set of second Y difference as a second Y difference;

calculates an Y-direction parallelism as an absolute value of a difference between the first Y difference and the second Y difference; and calculates the parallelism as a sum of the X-direction parallelism and the Y-direction parallelism.

6. The parallelism detection method according to claim 5, wherein the holding surface is a square surface, and the upper end of the first measurement tool sequentially contacts four corners of the holding surface.

7. The parallelism detection method according to claim 6, wherein the first measurement tool and the second measurement tool are same cones having sharp tips, the tip becomes the upper end of the first measurement tool in the first height detection process when a bottom surface of the cone is placed on the placement surface, and the tip becomes the lower end of the second measurement tool in the second height detection process when the bottom surface is held on the holding surface.

8. The parallelism detection method according to claim 5,
wherein the first measurement tool and the second measurement tool are same cones having sharp tips,
the tip becomes the upper end of the first measurement tool in the first height detection process when a bottom surface of the cone is placed on the placement surface, and
the tip becomes the lower end of the second measurement tool in the second height detection process when the bottom surface is held on the holding surface.

9. The parallelism detection method according to claim 2,
wherein the first measurement tool and the second measurement tool are same cones having sharp tips,
the tip becomes the upper end of the first measurement tool in the first height detection process when a bottom surface of the cone is placed on the placement surface, and
the tip becomes the lower end of the second measurement tool in the second height detection process when the bottom surface is held on the holding surface.

10. The parallelism detection method according to claim 1,
wherein the first measurement tool and the second measurement tool are same cones having sharp tips,
the tip becomes the upper end of the first measurement tool in the first height detection process when a bottom surface of the cone is placed on the placement surface, and
the tip becomes the lower end of the second measurement tool in the second height detection process when the bottom surface is held on the holding surface.

11. A mounting apparatus that mounts a semiconductor chip on a mounted body, the mounting apparatus comprising:
a stage comprising a placement surface on which the mounted body is placed,
a mounting head that sucks and holds the semiconductor chip on a holding surface facing the placement surface of the stage and moves in an X direction and an Y direction along the placement surface of the stage and a Z direction that comes into contact with and separates from the placement surface,
an encoder that detects a height of the mounting head, and
a controller that adjusts a movement of the mounting head and calculates a parallelism between the placement surface of the stage and the holding surface of the mounting head based on the height of the mounting head detected by the encoder,
wherein the controller:
detects a plurality the first heights of the mounting head, by arranging a first measurement tool having a predetermined height on the placement surface of the stage and repeatedly executing, at a plurality of measurement positions, an operation of lowering the mounting head to detect a first height of the mounting head by the encoder when the holding surface comes into contact with an upper end of the first measurement tool, when the upper end of the first measurement tool comes into contact with the holding surface;
detects a plurality of the second heights of the mounting head, by holding a second measurement tool on the holding surface of the mounting head and repeatedly executing, at the plurality of measurement positions, an operation of lowering the mounting head to detect a second height of the mounting head by the encoder when a lower end of the second measurement tool held on the holding surface comes into contact with the placement surface, when the lower end of the second measurement tool comes into contact with the placement surface; and
calculates the parallelism between the placement surface of the stage and the holding surface of the mounting head based on the plurality of the first heights and the plurality of the second heights.

12. The mounting apparatus according to claim 11,
wherein the controller:
calculates a first difference between the plurality of the first heights and a second difference between the plurality of the second heights, at the plurality of measurement positions; and
calculates the parallelism as an absolute value of a difference between the first difference and the second difference.

13. The mounting apparatus according to claim 12,
wherein the first measurement tool and the second measurement tool are same cones having sharp tips,
the tip becomes the upper end of the first measurement tool when a bottom surface is placed on the placement surface, and
the tip becomes the lower end of the second measurement tool when the bottom surface is held on the holding surface.

14. The mounting apparatus according to claim 11,
wherein the first measurement tool and the second measurement tool are same cones having sharp tips,
the tip becomes the upper end of the first measurement tool when a bottom surface is placed on the placement surface, and
the tip becomes the lower end of the second measurement tool when the bottom surface is held on the holding surface.

* * * * *